(12) United States Patent
O'Reilly et al.

(10) Patent No.: US 10,777,434 B2
(45) Date of Patent: Sep. 15, 2020

(54) SYSTEMS AND METHODS FOR A SPRAY MEASUREMENT APPARATUS

(71) Applicant: OEM Group, LLC, Gilbert, AZ (US)

(72) Inventors: Darren O'Reilly, Gilbert, AZ (US); Christian Forgey, Round Rock, TX (US); Joshua Levinson, Gilbert, AZ (US); Jeff Garbacik, Gilbert, AZ (US); Alexander Trufanov, Souderton, PA (US); Robert Kraiger, Gilbert, AZ (US); David Brady, Gilbert, AZ (US)

(73) Assignee: OEM Group, LLC, Gilbert, AZ (US)

( * ) Notice: Subject to any disclaimer, the term of this patent is extended or adjusted under 35 U.S.C. 154(b) by 0 days.

(21) Appl. No.: 16/505,450

(22) Filed: Jul. 8, 2019

(65) Prior Publication Data

US 2020/0013650 A1 Jan. 9, 2020

Related U.S. Application Data (60) Provisional application No. 62/694,661, filed on Jul. 6, 2018.

(51) Int. Cl.
| | |
|---|---|
| *H01L 21/67* | (2006.01) |
| *G01F 3/36* | (2006.01) |
| *B05B 12/00* | (2018.01) |

(52) U.S. Cl.
CPC ...... *H01L 21/67253* (2013.01); *B05B 12/006* (2013.01); *G01F 3/36* (2013.01); *H01L 21/6708* (2013.01); *H01L 21/67051* (2013.01)

(58) Field of Classification Search
CPC ......... H01L 21/67253; H01L 21/67051; H01L 21/6708; B05B 12/006; G01F 3/36

USPC .......................................................... 177/219
See application file for complete search history.

(56) References Cited

U.S. PATENT DOCUMENTS

| | | | |
|---|---|---|---|
| 4,816,081 A | 3/1989 | Mehta et al. | |
| 4,900,395 A | 2/1990 | Syverson et al. | |
| 5,728,220 A * | 3/1998 | Curcuri ................. | B05C 5/0216 118/305 |
| 8,844,546 B2 * | 9/2014 | Chen .................. | H01L 21/67051 134/144 |
| 2001/0047812 A1 * | 12/2001 | Bryer ........................ | B08B 3/02 134/10 |
| 2002/0063121 A1 | 5/2002 | Mokuo | |
| 2002/0100495 A1 * | 8/2002 | Bexten .................... | B08B 9/093 134/18 |
| 2002/0179122 A1 * | 12/2002 | Thompson ........ | H01L 21/67313 134/33 |
| 2005/0284375 A1 * | 12/2005 | Leeds ............... | H01L 21/67126 118/730 |
| 2006/0201541 A1 | 9/2006 | Ohnuma et al. | |
| 2006/0231125 A1 * | 10/2006 | Yi ..................... | H01L 21/67028 134/33 |

(Continued)

OTHER PUBLICATIONS

International Search Report and Written Opinion in corresponding PCT Application No. PCT/US2019-040864 dated Nov. 14, 2019, 15 pages.

*Primary Examiner* — Peter J Macchiarolo
*Assistant Examiner* — Monica S Young
(74) *Attorney, Agent, or Firm* — Polsinelli PC; Ari M. Bai (57) ABSTRACT

Various embodiments of a spray measurement system having a jig device that allows measuring spray output of one or more spray nozzles and determine spray distribution patterns of the spray nozzles are disclosed.

13 Claims, 13 Drawing Sheets

(56) References Cited

U.S. PATENT DOCUMENTS

2011/0284038 A1\* 11/2011 Bang ................. H01L 21/67051
134/166 R

\* cited by examiner

SYSTEMS AND METHODS FOR A SPRAY MEASUREMENT APPARATUS

CROSS REFERENCE TO RELATED APPLICATIONS

This is a non-provisional application that claims benefit to U.S. provisional application Ser. No. 62/694,661 filed on Jul. 6, 2018, which is herein incorporated by reference in its entirety.

FIELD

The present disclosure generally relates to a spray measurement apparatus, and in particular to systems and methods for a spray measurement apparatus capable of detecting liquid capture levels of one or more spray nozzles within a batch chemical process chamber for understanding spray distribution patterns.

BACKGROUND

Batch chemical process chambers for semiconductor wet chemical processing require a plurality of spray nozzles to spray a chemical onto a number of wafers stacked in an array inside the process chamber in a uniform manner. The malfunctioning of one or more spray nozzles or a misadjusted spray nozzle(s) can lead to non-uniformity in spray distribution, thereby preventing consistent or in-specification batch process completion. In addition, once an issue in the spray nozzle assembly is identified, it can be difficult and time-consuming to disassemble the batch process chamber to identify which nozzle(s) are malfunctioning and to take corrective action. As such, there lacks a system for easily and accurately monitoring and measuring spray distribution within a batch chemical process chamber.

It is with these observations in mind, among others, that various aspects of the present disclosure were conceived and developed.

Corresponding reference characters indicate corresponding elements among the view of the drawings. The headings used in the figures do not limit the scope of the claims. The drawings are an example of one embodiment of this invention.

DETAILED DESCRIPTION

In one aspect, a spray measurement apparatus having a jig device capable of measuring spray output and determining spray distribution of a plurality of individual spray nozzles is disclosed. In another aspect, the spray measurement apparatus is operable to measure liquid levels of multiple liquid capture channels associated with respective spray nozzles to understand spray distribution patterns. In yet another aspect, the spray measurement apparatus includes a controller in communication with a batch system, wherein the controller enables the spray measurement apparatus to rotate about a horizontal axis to a specific orientation within the batch chemical process chamber for inspection and utilization of other analytical models. In a further aspect, the spray measurement system allows for verification of the uniformity of spray across an entire semiconductor wafer load to ensure consistent process completion on all semiconductor wafers. In some embodiments, the spray measurement apparatus includes a jig device having a plurality of blocker plates disposed within a respective slot corresponding to a particular wafer location that allows for identification of one or more malfunctioning spray nozzles during operation of the spray management apparatus. Referring to the drawings, embodiments of spray measurement system are illustrated and generally indicated as 100 in FIGS. 1-13.

Figure 1:
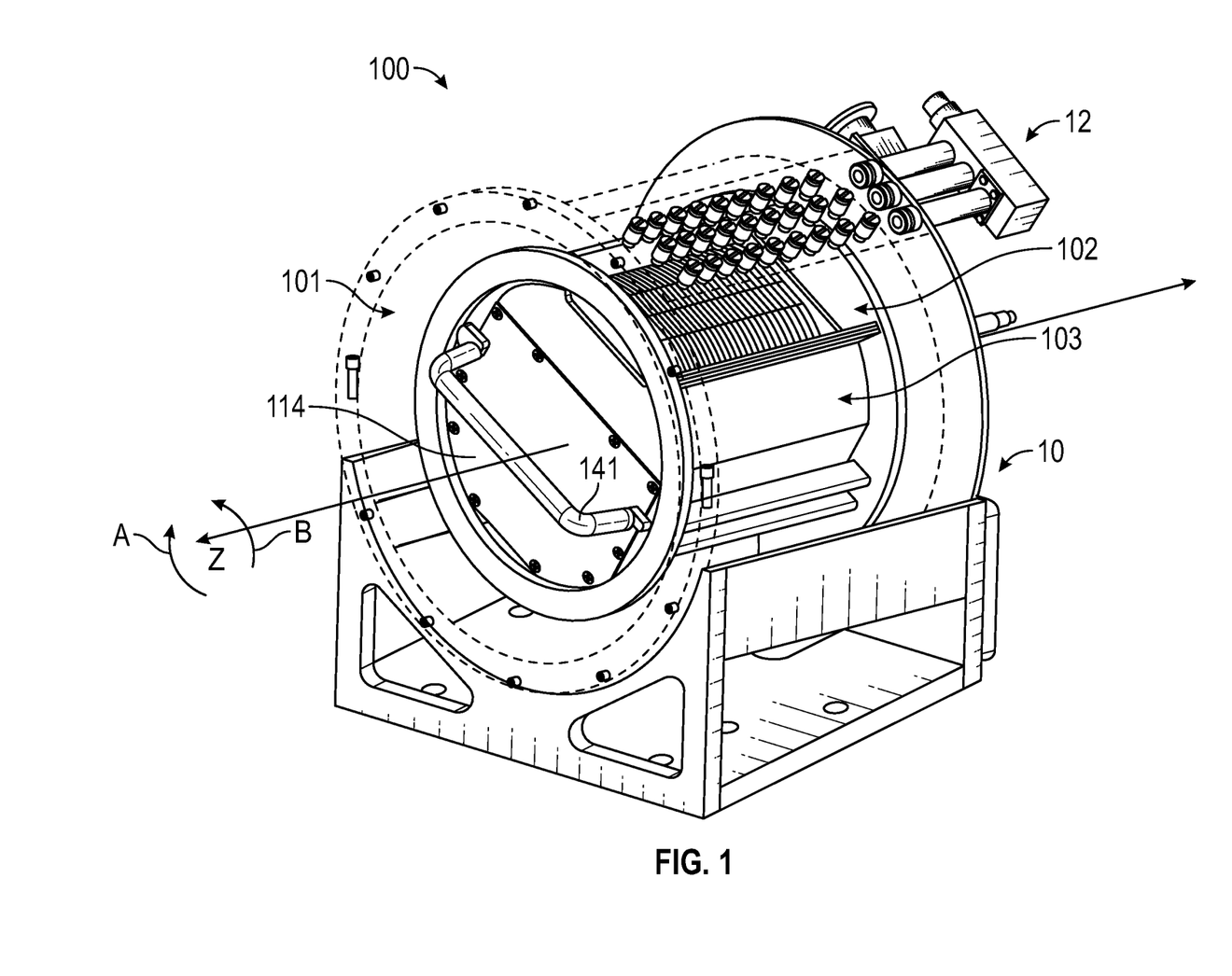
FIG. 1 is a perspective view of a spray measurement apparatus disposed within a rotor and batch process chamber and aligned to an array or spray nozzles.
Figure 2:
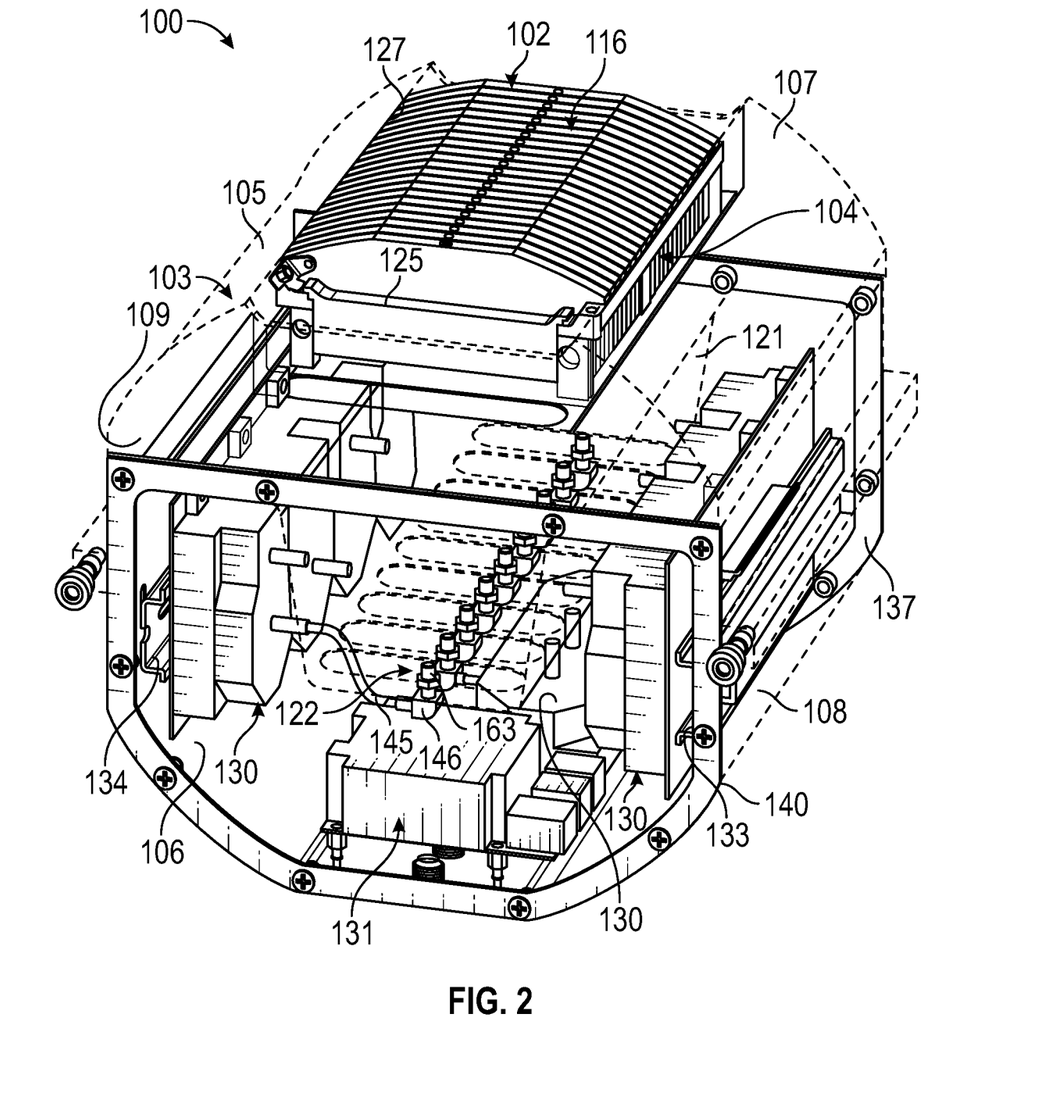
FIG. 2 is a perspective view of the spray measurement apparatus with the casing in phantom showing a jig device for use in measuring spray distribution.
Figure 3:
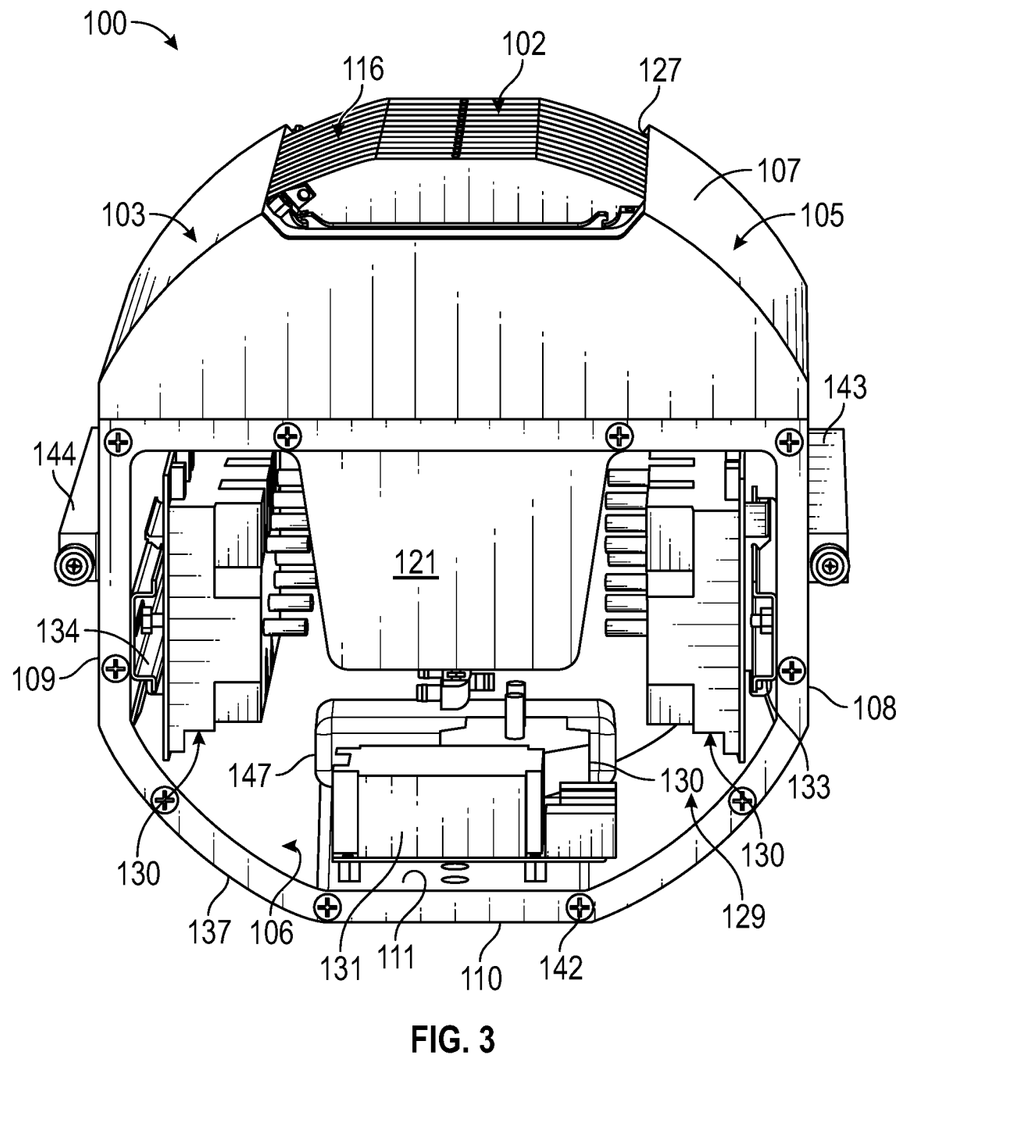
FIG. 3 is an end view of the spray measurement apparatus with the proximal end plate removed to illustrate the interior components.
Figure 4:
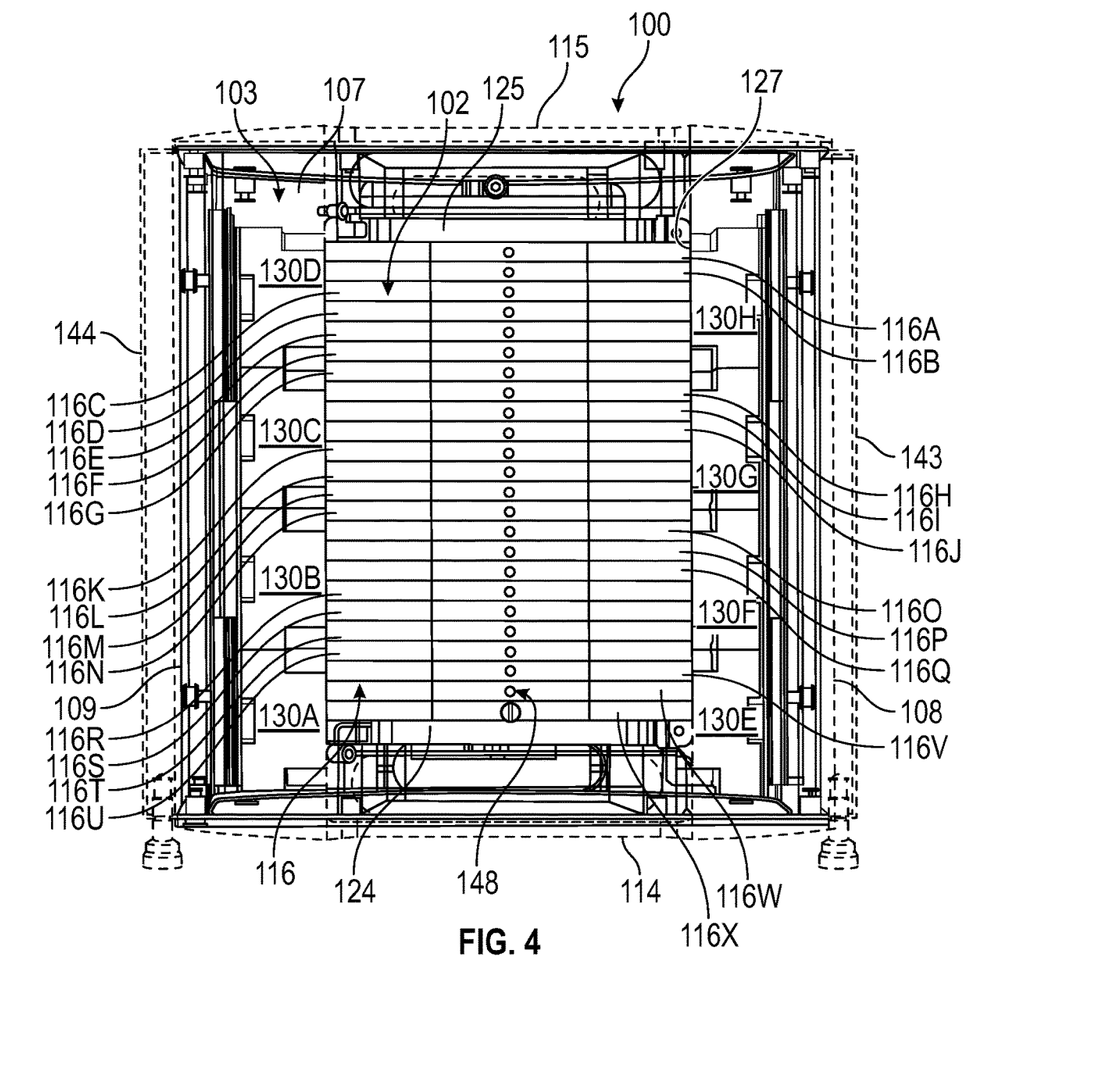
FIG. 4 is a top view of the spray measurement apparatus showing the blocker plates of the jig device.
Figure 5:
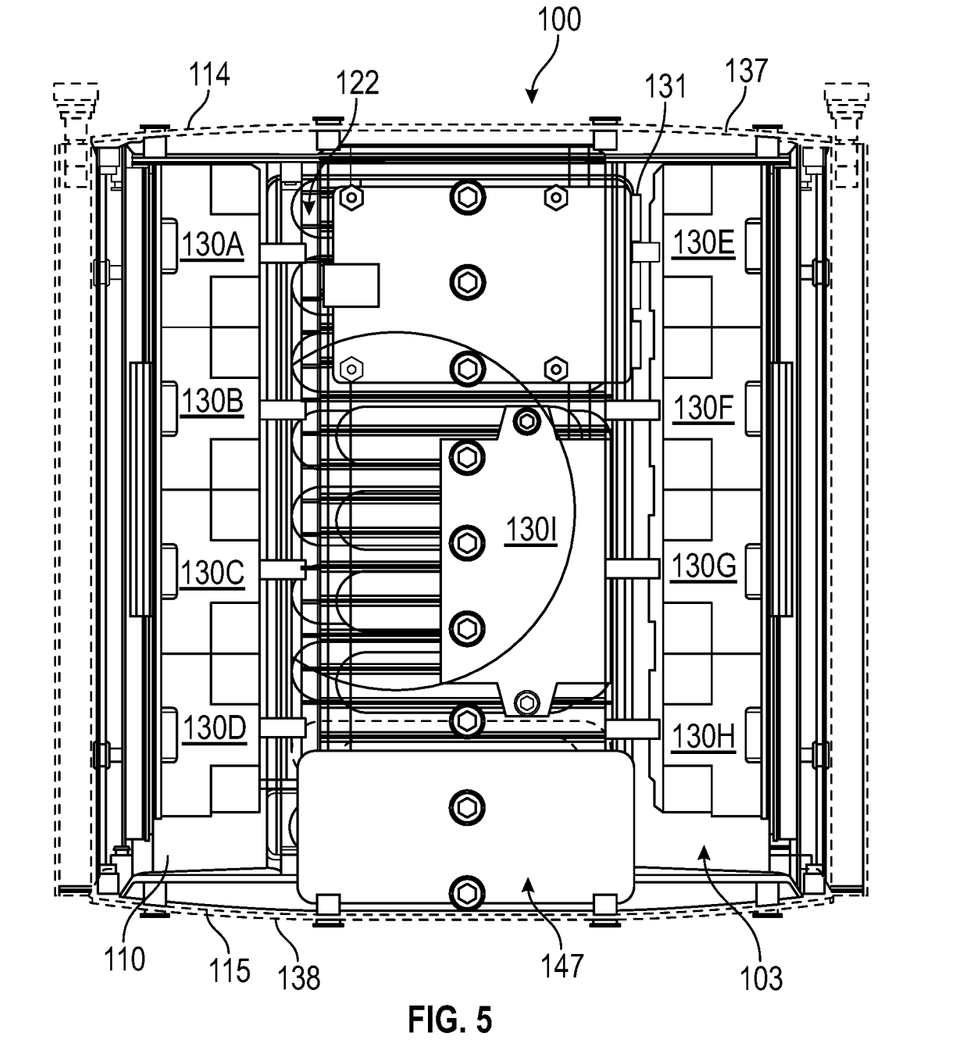
FIG. 5 is a bottom view of the spray measurement apparatus showing the casing in phantom to illustrate the interior components.
Figure 6:
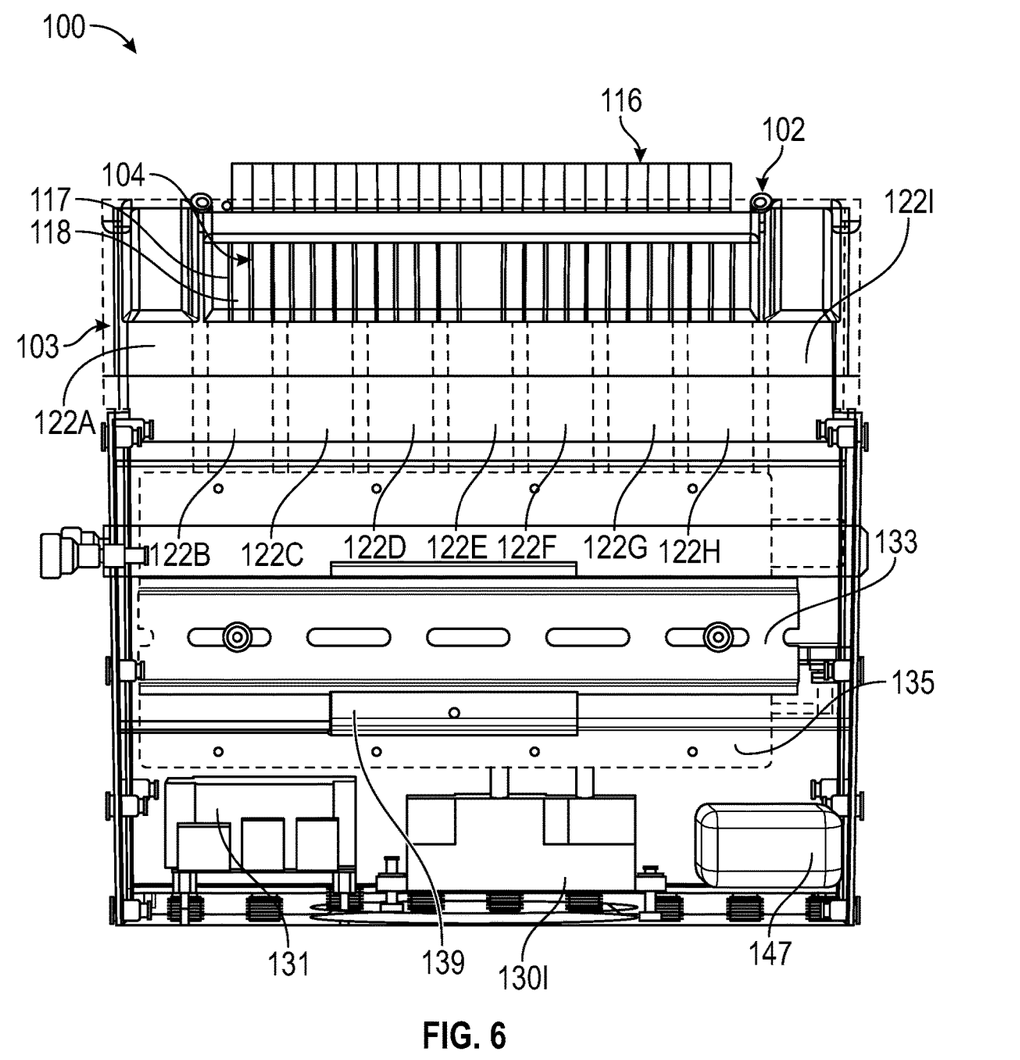
FIG. 6 is a side view of the spray measurement apparatus showing the casing in phantom to illustrate the interior components.
Figure 7:
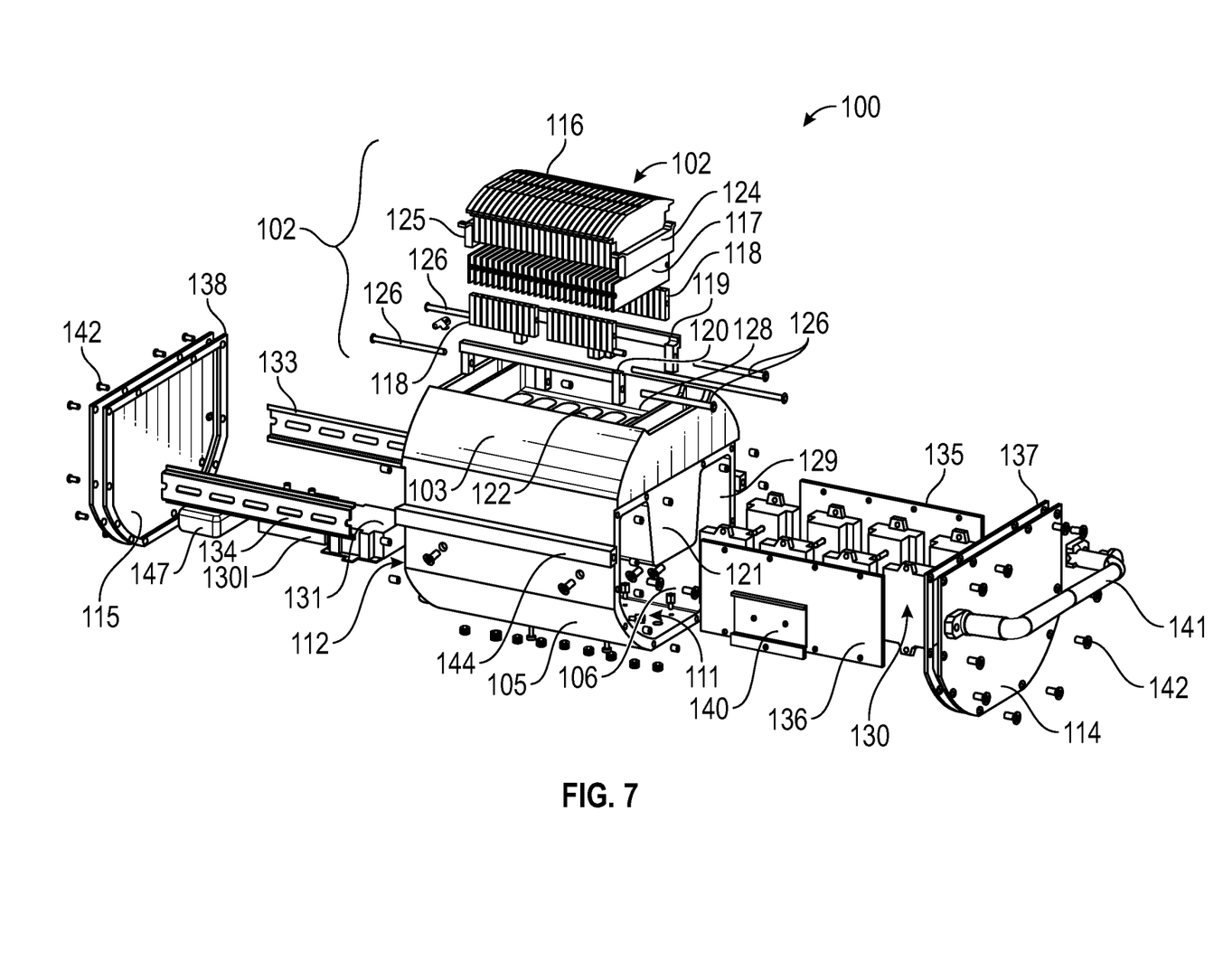
FIG. 7 is an exploded view of the spray measurement apparatus.
Figure 8:
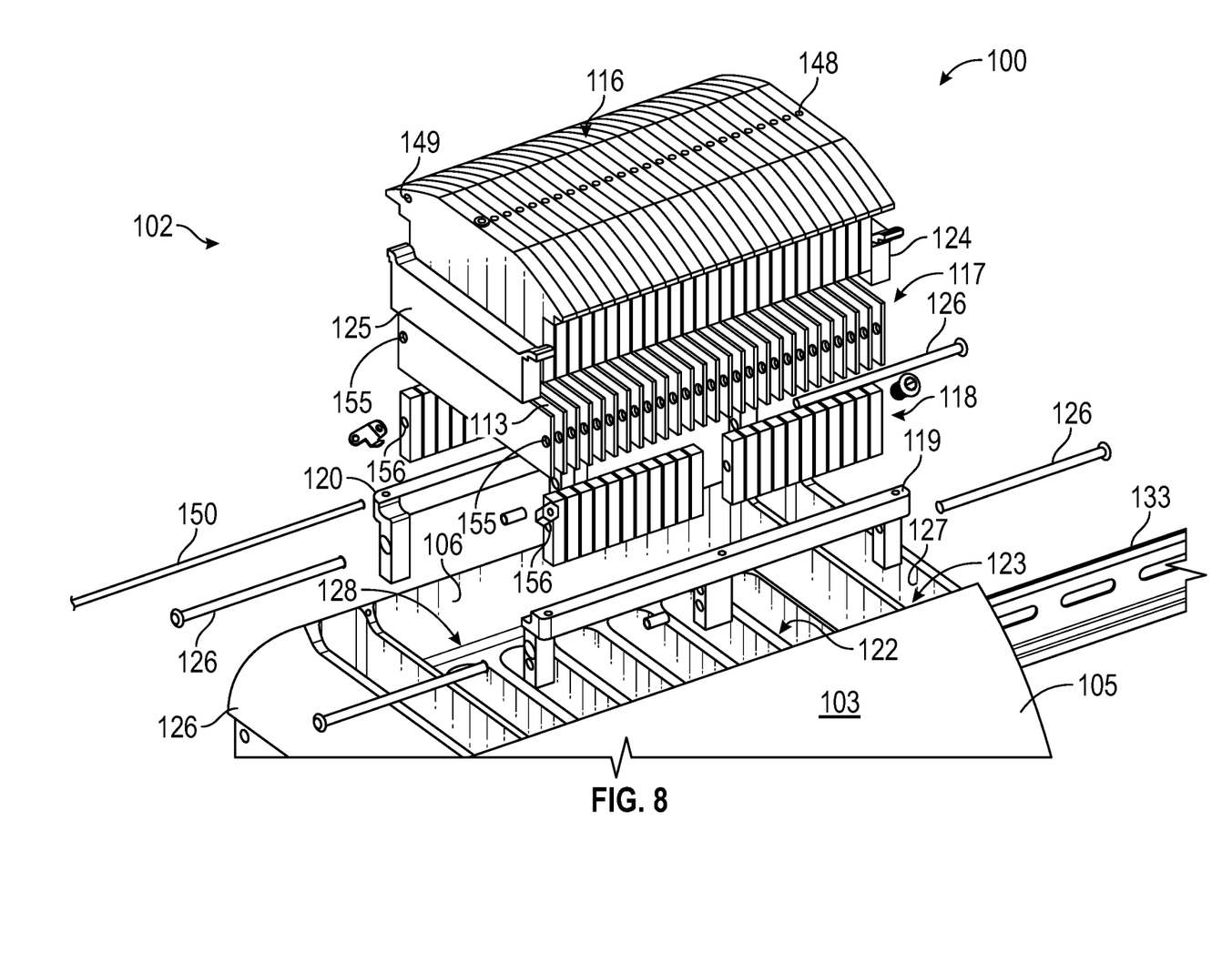
FIG. 8 is an enlarged exploded view of the spray measurement apparatus showing the jig device.

As shown in FIGS. 1-2, in some embodiments the spray measurement system 100 comprises a rotor 10, a spray measurement apparatus 101 disposed within the rotor 10, and a controller 131 which is operable to control and monitor operation of the spray measurement system 100. In addition, the controller 131 includes a data connection interface (not shown) that provides a means for collecting data or allowing the user to interact with the controller 131 to operate the spray measurement system 100. For example, the data connection interface may be operable to record the respective pressure related to the amount of liquid collected in the two end channels 123A and 123B as well as inner channels 122A-122G. In some embodiments, the spray measurement apparatus 101 includes a casing 103 configured to receive a jig device 102 that is operable for measuring spray output and determining spray distribution of multiple spray nozzles 12 in the batch chemical process chamber (not shown) as shall be discussed in greater detail below. In addition, the casing 103 is configured to allow the spray measurement apparatus 100 to be disposed within a rotor 10, wherein the rotor 10 is disposed within a batch chemical process chamber during operation when measuring the spray output. The spray measurement apparatus 100 is operable to be rotated by the rotor 10 along a horizontal axis Z to a specific rotation angle in order to collect spray output from the spray nozzle array 12 at the specific rotation angle to determine spray distribution.

Referring to FIGS. 1-5, in some embodiments the casing 103 forms an external surface 105 and an interior surface 106 that collectively define a top portion 107, first side portion 108, second side portion 109 and bottom portion 110 of casing 103. As shown specifically in FIGS. 1-3, the top portion 107 of casing 103 defines a top opening 127 in communication with an upper chamber 128 (FIGS. 6 and 11) in which the jig device 102 is partially disposed within and accessed through the top opening 127. As shown specifically in FIG. 4, the casing 103 defines a first side bar portion 143 and an opposing second side bar portion 144 on opposite sides of the casing 103 that provide a structural surface which allows the spray measurement apparatus 100 to be engaged and secured within the rotor 10 within the batch chemical process chamber along the first and second side bar portions 143 and 144.

Referring to FIG. 7, the casing 103 further defines a proximal opening 111 and a distal opening 112 that communicate with opposite ends of a lower chamber 129 formed within the casing 103. As shown, a proximal end plate 114 is configured to engage and seal off the proximal opening 111, while a distal end plate 115 is configured to engage and seal off the distal opening 112. In some embodiments, securing members 142, such as screws, are used to engage the proximal end plate 114 and distal end plate 115 to the casing 103. In some embodiments, a handle 141 is secured to the proximal end plate 114 for handling of the spray measurement apparatus 101.

As further shown in FIGS. 7 and 12, the upper chamber 128 of casing 103 communicates with a tank 121 disposed within the casing 103 and may be integral with the structure of the casing 103 or a separate component. The tank 121 defines a plurality of inner channels 122 and a pair of end channels 123 formed in an array that extend along the longitudinal axis of the casing 103. The inner channels 122 and end channels 123 of the tank 121 each provide a respective liquid capture site corresponding to one or more spray nozzles 12 such that the liquid spray from particular spray nozzles 12 may be captured within a respective inner channel 122 or end channel 123 for measurement as shall be discussed in greater detail below.

As shown in FIGS. 4-8, the jig device 102 provides a means for isolating particular wafer locations such that activation of particular spray nozzles 12 allows for the measurement of liquid collected from these spray nozzles 12 to determine spray distribution patterns including whether any spray nozzles 12 have malfunctioned or require adjustment. In some embodiments, the jig device 102 includes a plurality of blocker plates 116 aligned in an array in which each blocker plate 116 corresponds to a section of the spray nozzle array 12 among a plurality of possible sections of the spray nozzle array 12 within a batch chemical process chamber.

In some embodiments, the jig device 102 further includes a slot assembly 104 that defines a plurality of slots 113 in which an individual blocker plate 116 is positioned within a respective slot 113. As shown in FIGS. 6 and 7, the slot assembly 104 includes a plurality of slot plates 117 interposed between respective slot blocks 119 arranged on both ends of the slot plates 117 that collectively define each of the plurality of slots 113 formed in an array between a proximal plate 124 and a distal plate 125 when the slot assembly 104 is assembled during manufacturing. As shown, each of the slot plates 117 defines an aligned plate opening 155 configured to receive a rod 126 during assembly, while each set of the slot blocks 118 defines an aligned block opening 156 configured to also receive a rod 126 during assembly. When the slot assembly 104 is assembled, a respective rod 126 is inserted through each of the aligned set of block openings 156 and each of the aligned plate openings 155 to assemble each respective slot 113 of the slot assembly 104. In addition, the underside of the jig assembly 104 is engaged to a first support member 119 and a second support member 120 to secure the jig device 102 within the upper chamber 128 of the casing 103.

When the jig device 102 is assembled, a respective blocker plate 116 is disposed within a respective slot 113 along the slot assembly 104 and may be withdrawn or inserted into the slot 113 as desired. As further shown, each of the blocker plates 116 defines a respective protrusion 148 along the edge of the blocker plate 116 and is configured to allow a user to grasp the protrusion 148 to either withdraw or insert an individual blocker plate 116 relative to a respective slot 113. As such, any number of blocker plates 116 may be withdrawn from the slot assembly 104 of the jig device 102 when measuring spray nozzle output and determining spray distribution for an individual spray nozzle 12 or a group of spray nozzles 12 as shall be described in greater detail below.

Referring to FIGS. 2, 12 and 13, the jig device 102 is in fluid flow communication with the plurality of inner channels 122 and end channels 123 defined by tank 121 for capturing liquid that is sprayed by one or more of the spray nozzles 12 onto specific locations in which one or more blocker plates 116 have been removed from the jig device 102. In this manner, the spray measurement output and spray distribution pattern for a single spray nozzle 12 or a batch of spray nozzles 12 grouped together may be determined by measuring the amount of liquid collected in a respective channel 122. In some embodiments, the end channels 123 may be used to measure the spray measurement output and spray distribution pattern of the all the spray nozzles 12 collectively, while the inner channels 122 formed between end channels 123 may be used to measure the spray measurement output and spray distribution pattern of individual or select group of spray nozzles 12 when particular blocker plates 116 corresponding to those spray nozzles 12 are removed from the jig device 102 during testing of the spray nozzles 12. As shown in FIG. 12, the upper chamber 128 forms a shoulder 154 configured to abut the jig device 102 when inserted in the casing 103.

In some embodiments, the spray measurement apparatus 101 further includes a plurality of pressure transducers 130 in fluid flow communication with one or more channels 122 and 123 for measuring the amount of liquid deposited within particular a channel 122 and 123 after the spray nozzles 12 have been activated. In some embodiments, each pressure transducer 130 includes a first port 157 in communication with atmosphere and a second port 158 in communication with a respective channel 122 or 123 through a respective hose 145 in fluid flow communication with one of the channels 122 or 123. In some embodiments, each hose 145 is connected to a hose connector 146 for establishing fluid flow communication with a respective channel 122 and 123 through an opening 153 formed at the bottom of each channel 122 and 123 as illustrated in FIG. 12. In operation, each pressure transducer 130 collects pressure data indicative of the amount of liquid collected from a particular channel 122 and 123.

In one embodiment shown in FIG. 12, the tank 121 may define two end channels 123A and 123B as well as inner channels 122A-122G, although the number of channels 122 and 123 may be any of a plurality of channels 122 and 123 that may correspond to one or more spray nozzles 12 for purposes of measuring liquid collection. In one embodiment, the jig device 102 may include blocker plates 116A-116X in which each block plate 116A-116X corresponds to a particular wafer location during processing; however, any number of blocker plates 116 may be used to accommodate the number of wafer locations to be covered.

In one method of measuring spray output and determining spray distribution patterns using the spray measurement system 100, the spray measurement apparatus 101 is rotated about a horizontal axis Z to a specific testing angle away from the vertical. The spray nozzles 12, which remain stationary, spray a liquid and the liquid is collected into any of a plurality of channels 122 and 123. The spray measurement system 100 is subsequently rotated about a horizontal axis Z back to 0 degrees from vertical, wherein the pressure transducers 130 measure an amount of pressure in each of the channels 122 and 123, wherein the amount of pressure in each of the channels 122 and 123 corresponds to a volume of liquid collected in each of the channels 122 and 123. As the testing process continues, another testing angle is subsequently chosen and the process is repeated.

In another method of measuring spray output and determining spray distribution patterns using the spray measurement system 100, a user may remove one or more blocker plates 116, for example blocker plates 116J-116M, from the jig device 102 to determine if particular spray nozzles 12 associated with the location(s) of blocker plates 116J-116M are functioning properly and applying a uniform spray distribution pattern. Once liquid collection data has been collected from channel 122D, a verification that all of the spray nozzles 12 associated with location of blocker plates 116J-116M are functioning properly or that one or more spray nozzles 12 require replacement or adjustment.

As shown in FIGS. 1, 2, 3, 5-7, 9, and 10, the spray measurement system 100 also includes a controller 131 in operative communication with each of the pressure transducers 130. In addition, the controller 131 includes a data connection interface (not shown) that provides a means for collecting data or allowing the user to interact with the controller 131 to operate the spray measurement system 100. For example, the data connection interface may be operable to record the respective pressure related to the amount of liquid collected in the two end channels 123A and 123B as well as inner channels 122A-122G. In some embodiments, the controller 131 collects and stores data regarding the amount of liquid collected from particular channels 122 and 123 as well as data collected on different spray measurements at different testing angles within the batch chemical process chamber. In some embodiments, the controller 131 may be in wireless or wired communication with external devices (not shown) for controlling the operation of the spray measurement system 100. In some embodiments, the controller 131 may be incorporated with the entire batch chemical process chamber and would thereby control the rotation of the spray measurement apparatus 100 by the rotor 10.

In some embodiments, a battery 147 may provide power to all of the components of the spray measurement system 100, such as the controller 131 and pressure transducers 130. In some embodiments, the battery 147 may be rechargeable. In other embodiments, power may be provided through a power cable (not shown).

Figure 9:
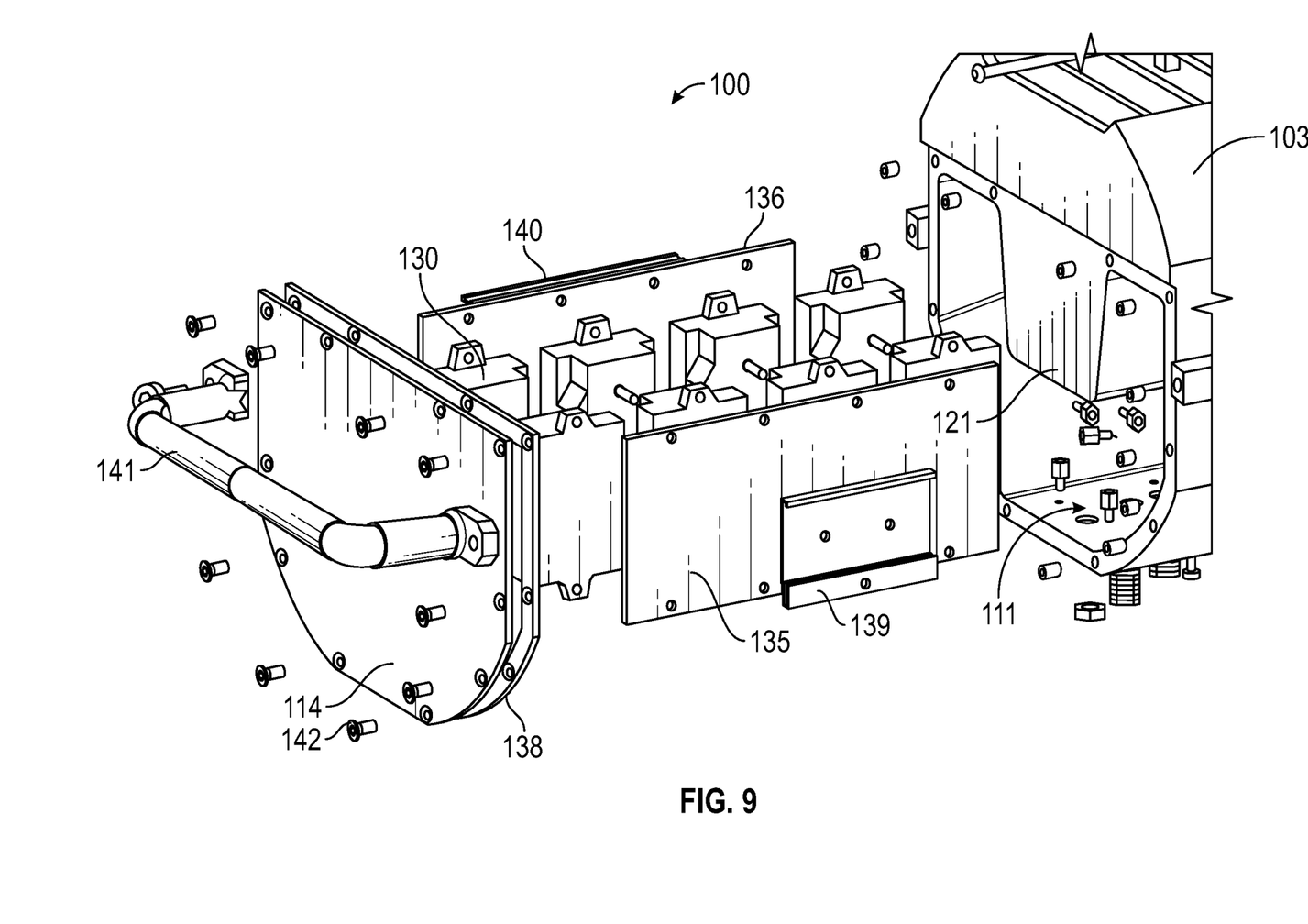
FIG. 9 is an enlarged exploded view of the spray measurement apparatus showing the array of pressure transducers.
Figure 10:
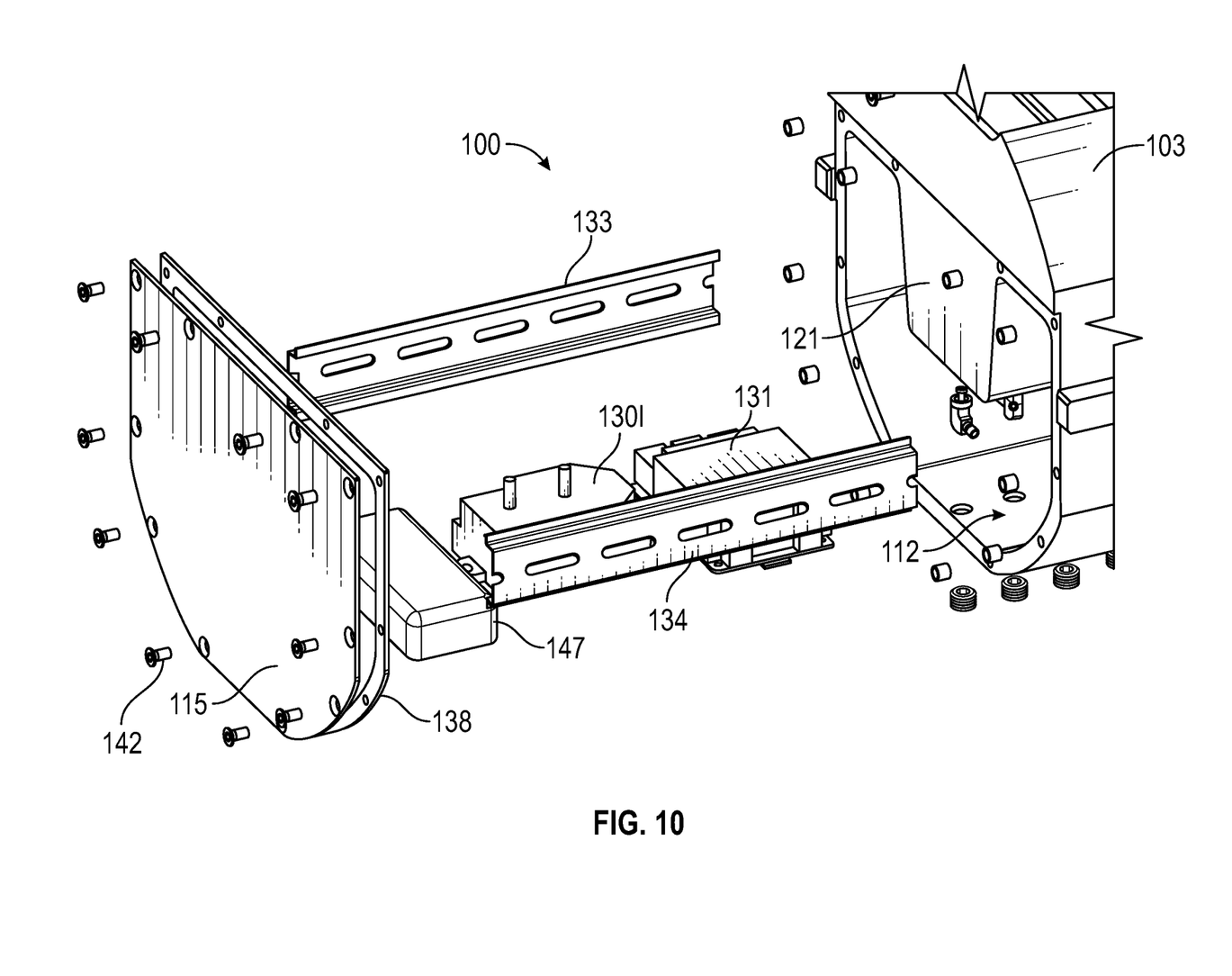
FIG. 10 is an enlarged exploded view of the spray measurement apparatus showing the controller, pressure transducer, and battery.

In some embodiments, a first array of pressure transducers 130A-130D may be secured to a second side plate 136 and a second array of pressure transducers 103E-130H may be secured to a first side plate 135 as shown in FIG. 9. In addition, a pressure transducer 1301 may also be used to accommodate nine total end channels 122 and inner channels 123 for the embodiment or casing 103 illustrated in FIG. 12. As further shown, the first side plate 135 includes a first bracket 139 that is engaged to a first rail member 133 mounted to the interior surface 106 of casing 103, while the second side plate 136 includes a second bracket 140 that is engaged to a second rail member 134 also mounted on the interior surface 106 of casing 103.

Figure 11:
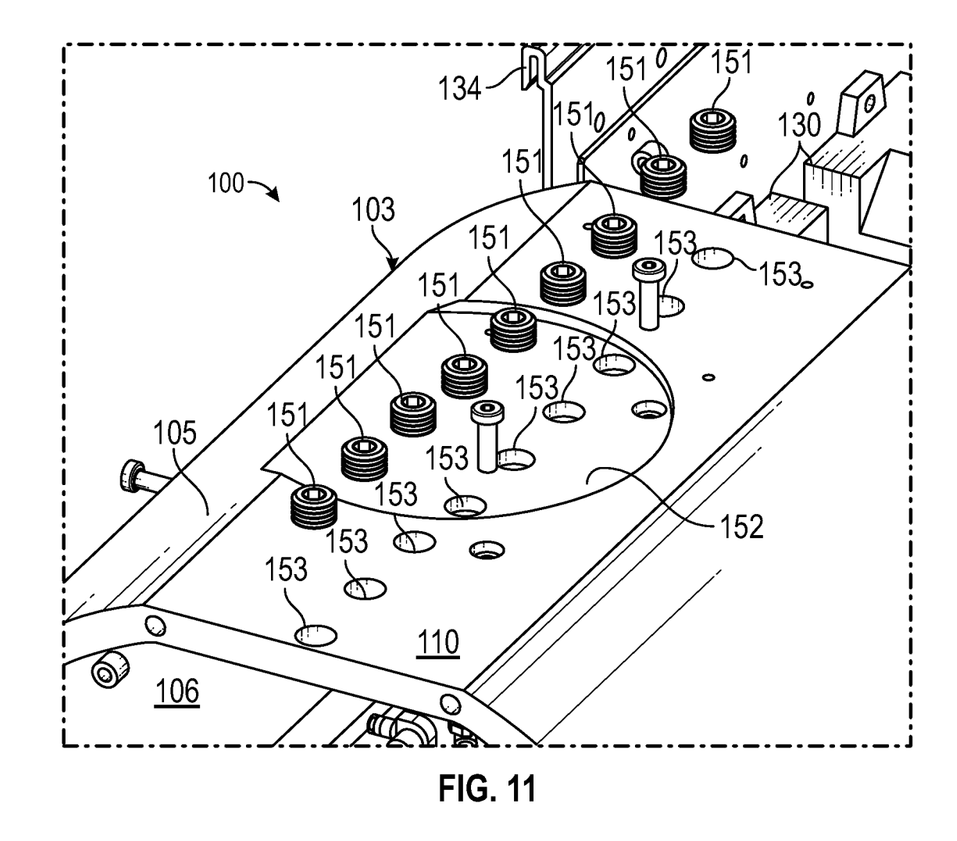
FIG. 11 is an enlarged perspective view of underside of the casing for the spray measurement apparatus.
Figure 12:
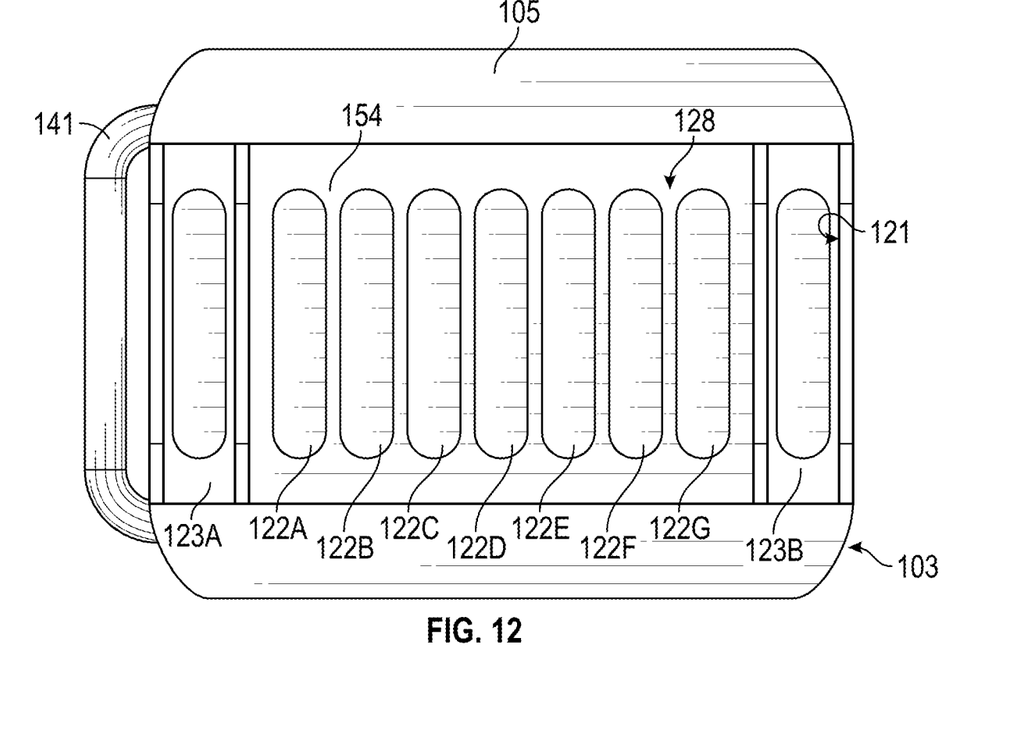
FIG. 12 is a top view of the casing for the spray measurement apparatus showing the tank of the casing.
Figure 13:
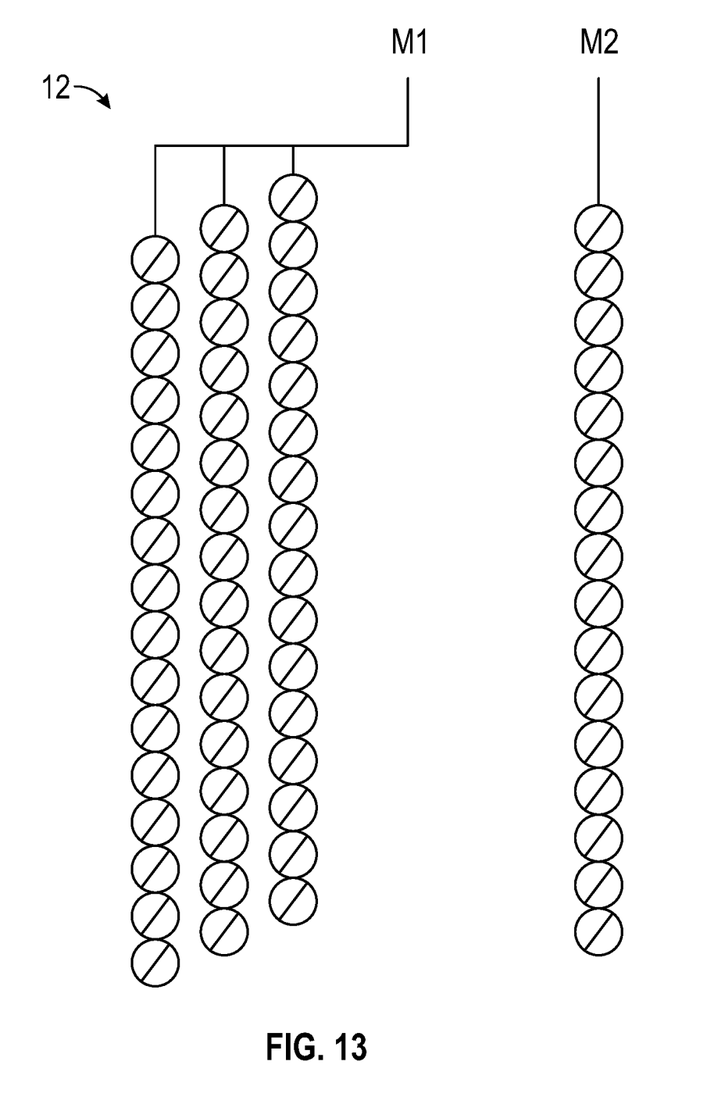
FIG. 13 is an illustration showing one arrangement of a plurality of spray nozzles measured by the spray measurement system.

Referring to FIG. 11, the bottom portion 110 of casing 103 defines a plurality of openings 153 each configured to receive a respective plug 151. In some embodiments, bottom portion 110 of casing 103 further defines an indentation 152 configured to act as a mount when securing the casing 103 within the rotor 10 of the batch chemical process chamber.

It should be understood from the foregoing that, while particular embodiments have been illustrated and described, various modifications can be made thereto without departing from the spirit and scope of the invention as will be apparent to those skilled in the art. Such changes and modifications are within the scope and teachings of this invention as defined in the claims appended hereto.

What is claimed is:

1. A spray measurement system, comprising:
  a rotor disposed within a batch chemical processing chamber, wherein the rotor is operable to rotate around a horizontal axis Z, wherein the rotor is operable to rotate in a clockwise or counterclockwise direction A and an opposite clockwise or counterclockwise direction B;
  a spray measurement apparatus in operative association with the rotor, the spray measurement apparatus comprising:
    a jig device, comprising a plurality of slots, wherein each of the plurality of slots is operable to receive a blocker plate; and
    one or more channels corresponding with one or more of the plurality of slots, wherein each of the one or more channels is in operative association with a respective pressure transducer for measuring an amount of liquid collected in the channel;
    wherein the spray measurement apparatus is operable to be rotated between a vertical resting position and a predetermined testing angle by the rotor; and;
  a controller in operative association with the rotor, wherein the controller is operable to rotate the rotor around the horizontal axis Z, wherein the controller is operable to rotate the rotor in the clockwise or counterclockwise direction A and the opposite clockwise or counterclockwise direction B between the vertical resting position and a predetermined testing angle;
  wherein the spray measurement apparatus is operable to be rotated to a predetermined testing angle and receive an amount of liquid sprayed by a spray nozzle array into the one or more of the channels, wherein a data collection interface is operable to record the amount of liquid collected in each of the one or more channels.

2. The system of claim 1, wherein the spray nozzle array remains in a fixed position angled above the spray measurement apparatus, wherein the spray nozzle array is operable to spray the amount of liquid at the spray measurement apparatus.

3. The system of claim 1, wherein each of the plurality of blocker plates prevent liquid from entering a corresponding slot of the plurality of slots, and wherein the manual removal of blocker plates allows liquid to enter a corresponding slot of the plurality of slots.

4. The system of claim 1, wherein the spray measurement apparatus is secured within the rotor using first and second side bar portions formed along respective opposite sides of a casing.

5. The system of claim 1, wherein the controller is operable to record and analyze information collected by the data collection interface.

6. The system of claim 1, wherein a malfunctioning spray nozzle of the spray nozzle array is identified by measuring an amount of liquid collected in each of the plurality of channels.

7. A method of measuring spray output using a spray measurement system, comprising:
- rotating a rotor in operative association with a spray measurement apparatus having a plurality of channels, wherein the rotor and spray measurement apparatus are rotated in a clockwise or counterclockwise direction A along a horizontal axis Z, wherein the rotor and spray apparatus are rotated from a vertical position to a predetermined testing angle;
- spraying an amount of liquid from a fixed spray nozzle array at the spray measurement apparatus, wherein a volume of liquid from the fixed spray nozzle array is collected into one or more of the plurality of channels of the spray measurement apparatus;
- rotating the rotor in operative association with the spray measurement apparatus in an opposite counterclockwise or clockwise direction B along the horizontal axis Z such that the spray measurement apparatus having collected an amount of the liquid is returned to a vertical position; and
- measuring the volume of liquid in one or more of the plurality of channels.

8. The method of claim 7, further comprising:
- configuring one or more channels for testing of one or more of spray nozzles by adding or removing one or more of a plurality of blocker plates, wherein each of the plurality of blocker plates is configured to be disposed within a respective slot of a slot assembly of the spray measurement apparatus, wherein a respective slot is associated with one of the plurality of channels such that the amount of liquid sprayed by one or more spray nozzles at that respective slot is collected at one of the plurality of channels.

9. The method of claim 7, wherein the method of measuring spray output is repeated, wherein each repetition of the method of measuring spray output is at a different testing angle.

10. The method of claim 9, wherein a malfunctioning spray nozzle from the spray nozzle array is identified by measuring the volume of liquid collected in each of the plurality of channels across one or more testing angles.

11. The method of claim 7, wherein the volume of liquid in a respective channel of the spray measurement apparatus is measured by measuring the amount of pressure in the respective channel using a respective pressure transducer, wherein the amount of pressure in the channel corresponds to the volume of liquid collected in the channel.

12. The method of claim 11, wherein a data collection interface in operative communication with the pressure transducers is operable to record and analyze data pertaining to the amount of pressure in each of the plurality of channels.

13. The method of claim 7, wherein a controller in operative communication with the rotor is operable to rotate the rotor, thereby rotating the spray measurement apparatus.

\* \* \* \* \*